(12) United States Patent
Takizawa

(10) Patent No.: US 9,049,799 B2
(45) Date of Patent: Jun. 2, 2015

(54) WIRING SUBSTRATE

(71) Applicant: SHINKO ELECTRIC INDUSTRIES CO., LTD., Nagano-ken (JP)

(72) Inventor: Daisuke Takizawa, Nagano-ken (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 25 days.

(21) Appl. No.: 14/021,189

(22) Filed: Sep. 9, 2013

(65) Prior Publication Data

US 2014/0085847 A1 Mar. 27, 2014

(30) Foreign Application Priority Data

Sep. 27, 2012 (JP) ................. 2012-214437

(51) Int. Cl.
| | |
|---|---|
| *H05K 1/18* | (2006.01) |
| *H05K 3/46* | (2006.01) |
| *H01L 23/50* | (2006.01) |
| *H01L 23/498* | (2006.01) |

(52) U.S. Cl.
CPC .......... *H05K 1/184* (2013.01); *H01L 23/49822* (2013.01); *H05K 1/185* (2013.01); *H05K 3/4602* (2013.01); *H05K 2201/09854* (2013.01); *H05K 2201/10636* (2013.01); *H01L 2224/16225* (2013.01); *H01L 2924/1531* (2013.01); *H01L 23/49827* (2013.01); *H01L 23/50* (2013.01)

(58) Field of Classification Search
USPC ......................... 361/762, 764, 761; 438/118
See application file for complete search history.

(56) References Cited

U.S. PATENT DOCUMENTS

| | | | | |
|---|---|---|---|---|
| 2005/0211465 | A1* | 9/2005 | Sunohara et al. | 174/260 |
| 2012/0142147 | A1* | 6/2012 | Sakai et al. | 438/118 |

FOREIGN PATENT DOCUMENTS

JP 2007-258541 10/2007

* cited by examiner

*Primary Examiner* — Andargie M Aychillhum
(74) *Attorney, Agent, or Firm* — Fish & Richardson P.C.

(57) ABSTRACT

A wiring substrate is provided with a core substrate including a first main surface, a second main surface, and a through hole. An electronic component including a resin cover is arranged in the through hole. A projection projects from an inner wall of the through hole toward the resin cover of the electronic component. An insulator is filled between the inner wall of the through hole and the electronic component. A first insulation layer covers the electronic component and the first main surface. A second insulation layer covers the electronic component and the second main surface. The resin cover of the electronic component includes an engagement groove formed by the projection and extending along a direction in which the electronic component is fitted into the through hole.

13 Claims, 6 Drawing Sheets

Fig.2
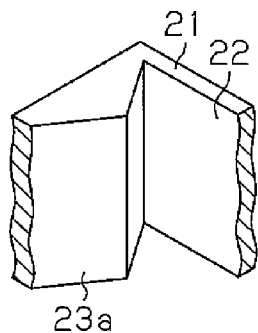
Fig.3A
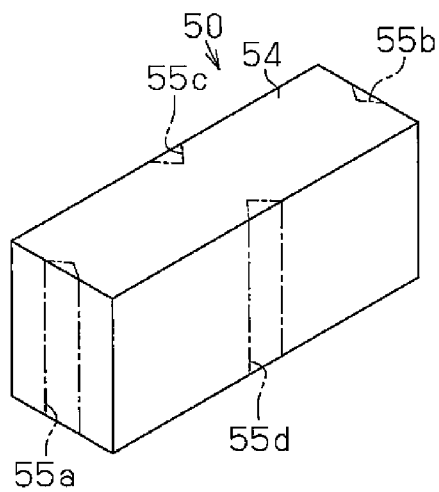
Fig.3B
Fig.3C
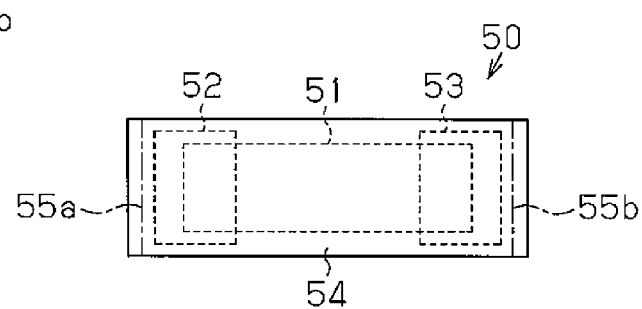
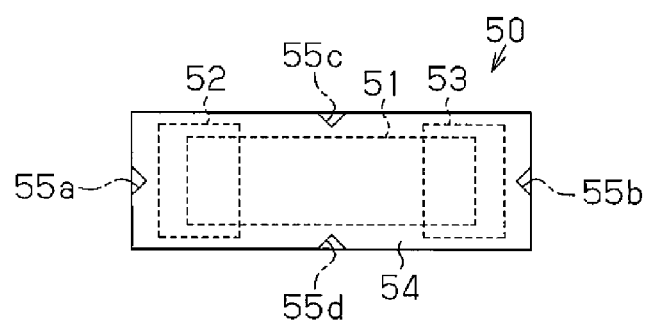
Fig.4
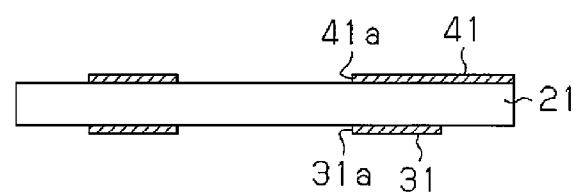

US 9,049,799 B2

WIRING SUBSTRATE

CROSS-REFERENCE TO RELATED APPLICATIONS

This application is based upon and claims the benefit of priority from prior Japanese Patent Application No. 2012-214437, filed on Sep. 27, 2012, the entire contents of which are incorporated herein by reference.

FIELD

The present disclosure relates to a wiring substrate.

BACKGROUND

Japanese Laid-Open Patent Publication No. 2007-258541 describes a wiring substrate incorporating electronic components such as chip capacitors. A wiring substrate includes a core substrate including a through hole. The through hole of the core substrate receives an electronic component. To manufacture the wiring substrate, a core substrate including a through hole that is larger than the electronic component is first prepared. A tape is first temporarily fastened to one side of the core substrate in order to seal the through hole. The electronic component is arranged in the through hole from the side that is not sealed by the tape. Under this situation, an insulation layer is formed on the surface of the core substrate that is free from the tape to fix the electronic components. Then, the tape is removed from the core substrate.

SUMMARY

When forming the insulation layer with the tape temporarily fastened to the core substrate, the pressure applied to the core substrate when forming the insulation layer results in the tape being rigidly fastened to the core substrate. Thus, when removing the tape from the core substrate, the adhesive agent of the tape may remain on the core substrate. The residual adhesive agent may cause warping of the wiring substrate or defoliation of the insulation layer from the core substrate. As a result, the wiring substrate may become defective.

One aspect of the present disclosure is a wiring substrate provided with a core substrate including a first main surface, a second main surface, and a through hole. An electronic component including a resin cover is arranged in the through hole so that an outer surface of the resin cover faces an inner wall of the through hole. A projection projects from the inner wall of the through hole toward the resin cover of the electronic component. An insulator is filled between the inner wall of the through hole and the electronic component. A first insulation layer covers the electronic component and the first main surface of the core substrate. A second insulation layer covers the electronic component and the second main surface of the core substrate. The resin cover of the electronic component includes an engagement groove formed by the projection and extending along a direction in which the electronic component is fitted into the through hole.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

The invention, together with objects and advantages thereof, may best be understood by reference to the following description of the presently preferred embodiments together with the accompanying drawings in which:

FIG. 2 is a perspective view illustrating a projection that projects into the through hole from a wall of the through hole;

FIGS. 3A, 3B and 3C are respectively a perspective view, a side view, and a plan view of the chip capacitor;

FIG. 4 is a cross-sectional view illustrating a manufacturing process of the wiring substrate;

DETAILED DESCRIPTION OF EMBODIMENTS

One embodiment will now be described with reference to the drawings.

Elements in the accompanying drawings are illustrated for simplicity and clarity and have not necessarily been drawn to scale. Hatching lines may be removed from the cross-sectional views to facilitate understanding.

Figure 1A:
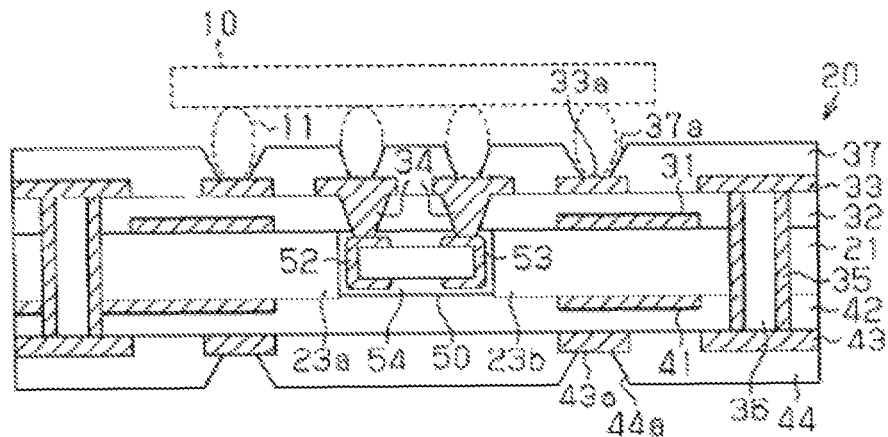
FIG. 1A is a cross-sectional view of a wiring substrate taken along line A-A in FIG. 1C.

Referring to FIG. 1A, an electronic device includes a semiconductor chip 10 and a wiring substrate 20. The semiconductor chip 10 is mounted on a first main surface (upper surface as viewed in the drawing) of the wiring substrate 20. The wiring substrate 20 is mounted on a substrate such as a motherboard. Further, the wiring substrate 20 may be used for a semiconductor package that supports chips such as a CPU.

The wiring substrate 20 includes a core substrate 21. The core substrate 21 may be, for example, a glass epoxy substrate formed by impregnating a glass cloth (glass fabric), which is an example of a reinforcement material, with a thermosetting insulative resin of which the main component is an epoxy resin. The reinforcement material is not limited to a glass cloth and may be, for example, a nonwoven glass fabric, an aramid fabric, an aramid nonwoven fabric, a liquid crystal polymer (LCP) fabric, or an LCP nonwoven fabric. The thermosetting insulative resin is not limited to epoxy resin and may be a resin material such as polyimide resin or cyanate resin.

A through hole 22 extends through the core substrate 21 from the upper surface (first main surface) to the lower surface (second main surface). Referring to FIG. 1C, the through hole 22 is generally tetragonal as viewed from above. FIG. 1C illustrates a tetragonal portion of the core substrate 21 where an oblong opening of the through hole 22 is formed.

A chip capacitor 50 is arranged in the through hole 22. The chip capacitor 50 is one example of an electronic component. As illustrated in FIGS. 3A and 3B, the chip capacitor 50 is shaped in a rectangular cuboid. As illustrated in FIGS. 3B and 3C, the chip capacitor 50 includes a box-shaped capacitor body 51, two connection terminals 52 and 53 arranged on the two longitudinal ends of the capacitor body 51, and a resin jacket 54 covering the capacitor body 51 and the connection terminals 52 and 53. The resin jacket 54 is an example of a resin cover.

The capacitor body 51 is mainly formed by, for example, ceramic and electrodes of copper. The material of the connection terminals 52 and 53 is, for example, copper. The connection terminals 52 and 53 are formed to cover the longitudinal end surfaces and side surfaces of the capacitor body 51. The connection terminals 52 and 53 have a thickness of, for example, 50 μm.

The resin jacket 54 is formed by, for example, a thermosetting resin. The thermosetting resin may be, for example, an epoxy resin, a polyimide resin, an acrylic resin, a cyanate resin or the like. Portions of the resin jacket 54 covering the connection terminals 52 and 53 have a thickness of, for example, 30 μm. A portion of the resin jacket 54 covering the capacitor body 51 has a thickness of, for example, 80 μm.

As illustrated in FIG. 1C, the core substrate 21 includes a plurality of projections 23a, 23b, 24a, and 24b facing the end surfaces and side surfaces of the chip capacitor 50 in the through hole 22. In the illustrated example, each of the projections 23a and 23b is a triangular prism that includes a base defined by the corresponding short side of the rectangle indicated by broken lines in FIG. 1C corresponding to the through hole 22. Similarly, each of the projections 24a and 24b is a triangular prism that includes a base defined by the corresponding long side of the rectangle corresponding to the through hole 22. The projections 23a and 23b project toward the resin jacket 54 covering the connection terminals 52 and 53. The projections 24a and 24b project toward the resin jacket 54 covering the capacitor body 51.

The size of the projections 23a and 23b is set so that the distance between the tips of the projections 23a and 23b is shorter than the length of the chip capacitor 50 and longer than the length of the capacitor body 51. Similarly, the size of the projections 24a and 24b is set so that the distance between the tips of the projections 24a and 24b is shorter than the width of the chip capacitor 50 and longer than the width of the capacitor body 51.

The projections 23a, 23b, 24a and 24b are formed from the same material of the core substrate 21, that is, a hardened resin with a reinforcement material (e.g., a glass cloth). This results in the tips of the projections 23a to 24b biting into the resin jacket 54 of the chip capacitor 50. Thus, the projections 23a, 23b, 24a and 24b support the chip capacitor 50 in the through hole 22. When arranging the chip capacitor 50 in the through hole 22, the projections 23a to 24b form engagement grooves 55a to 55d in the resin jacket 54, respectively. Accordingly, the engagement grooves 55a to 55d are shaped in close conformance to the corresponding projections 23a to 24b. In FIGS. 3A to 3C, the broken lines indicate where the engagement grooves 55a to 55d are formed. Since the tips of the projections 23a to 24b do not reach the capacitor body 51, the projections 23a to 24b do not damage the capacitor body 51.

As illustrated in FIG. 2, the tip of the projection 23a is in the through hole 22 and the tip extends continuously in the thickness-wise direction of the core substrate 21. FIG. 2 is a perspective cross-sectional view illustrating the tetragonal portion of the core substrate 21 where the through hole 22 is formed. Although not illustrated in the drawings, in the same manner as the projection 23a, in the through hole 22, the projections 23b, 24a and 24b are formed so that the tips extend continuously in the thickness-wise direction of the core substrate 21. Accordingly, as illustrated in FIGS. 3A to 3C, the projections 23a to 24b form straight engagement grooves 55a to 55d in the resin jacket 54 of the chip capacitor 50. This suppresses rotation of the chip capacitor 50. The projections 23a to 24b are examples of a peaked and elongated projection.

Figure 1B:
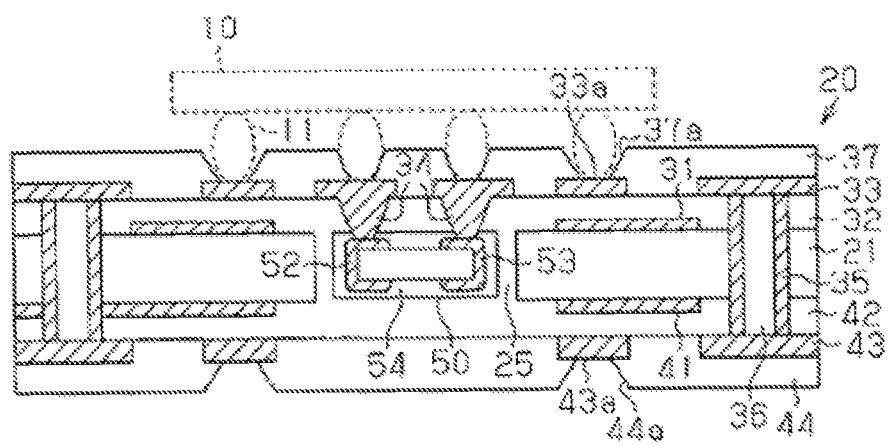
FIG. 1B is a cross-sectional view of the wiring substrate taken along line B-B in FIG. 1C.
Figure 1C:
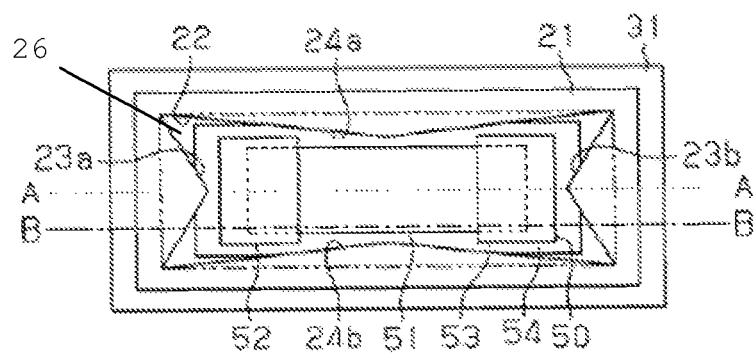
FIG. 1C is a schematic plan view illustrating a core substrate.

Referring to FIG. 1B, an insulator 25 fills the through hole 22. The insulator 25 is formed by filling the through hole 22 with a resin and then hardening the resin. The resin has a viscosity allowing for the resin to fill the through hole 22. The resin used for the insulator 25 may be, for example, an epoxy resin, a polyimide resin, or an acrylic resin.

As illustrated in FIGS. 1A and 1B, a wiring layer 31, an insulation layer 32, and a wiring layer 33 are sequentially formed on the upper surface of the core substrate 21. In the same manner, a wiring layer 41, an insulation layer 42, and a wiring layer 43 are sequentially formed on the lower surface of the core substrate 21. The wiring layers 31, 33, 41, and 43 are formed from, for example, copper. The insulation layers 32 and 42 are formed from an epoxy resin, a polyimide resin, an acrylic resin, or the like. Vias 34 extending through the insulation layer 32 connect portions of the pattern of the wiring layer 31 to the connection terminals 52 and 53 of the chip capacitor 50. Through holes 35 extending through the core substrate 21 and the insulation layers 32 and 42 connect portions of the patterns of the wiring layers 31, 33, 41, and 43 to one another. The through holes 35 are tubular and filled with an insulator 36. The insulator 36 is formed by filling each through hole 35 with a resin and then hardening the resin. The resin has a viscosity allowing for the resin to fill the through hole 35. The resin used for the insulator 36 may be, for example, an epoxy resin, a polyimide resin, an acrylic resin, or the like. Although not illustrated in the drawings, vias extending through the insulation layer 32 connect portions of the patterns of the wiring layers 31 and 33, and vias extending through the insulation layer 42 connect portions of the patterns of the wiring layers 41 and 43. Through electrodes may be formed in the core substrate 21 to electrically connect the wiring layers 31 and 41 that are formed on the two opposite surfaces of the core substrate 21.

A resist film 37 covers the insulation layer 32 and the wiring layer 33. The resist film 37 includes openings 37a that expose portions of the wiring layer 33 as connection pads 33a. In the same manner, a resist film 44 covers the insulation layer 42 and the wiring layer 43. The resist film 44 includes openings 44a that expose portions of the wiring layer 43 as connection pads 43a.

As illustrated in FIG. 1A, bumps 11 of a semiconductor chip 10 are connected to the pads 33a. Accordingly, the bumps 11, the pads 33a (wiring layer 33), and the vias 34 connect the semiconductor chip 10 to the chip capacitor 50. Although not illustrated in the drawings, the pads 43a are connected by bumps (solder balls or the like) to a substrate such as a motherboard.

A method of manufacturing the wiring substrate 20 will now be described.

As illustrated in FIG. 4, metal foils on the two opposite surfaces of the core substrate 21 are patterned by, for example, etching or the like to form the wiring layers 31 and 41. Here, openings 31a and 41a may be formed in the wiring layers 31 and 41 in accordance with a location and size of the through hole 22 of FIG. 1A which is formed later.

Figure 5A:
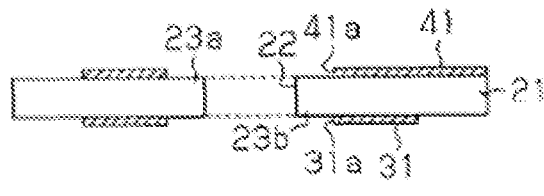
FIGS. 5A and 5B are respectively a cross-sectional view and a partial plan view illustrating a manufacturing process of the wiring substrate.
Figure 5B:
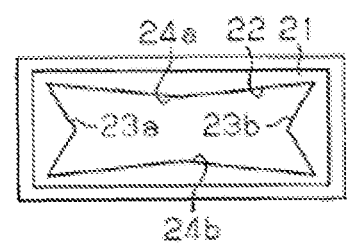

Referring to FIGS. 5A and 5B, the projections 23a to 24b are formed in the core substrate 21. A pressing machine or a laser processing machine, for example, may be used to form the through hole 22 and the projections 23a to 24b.

Figure 6A:
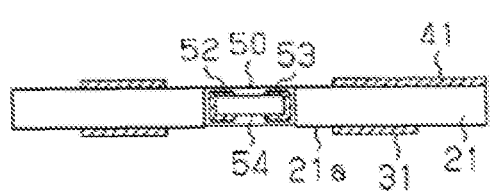
FIGS. 6A and 6B are respectively a cross-sectional view and a partial plan view illustrating a manufacturing process of the wiring substrate.
Figure 6B:
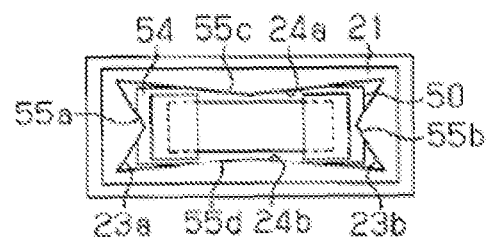

Referring to FIGS. 6A and 6B, the chip capacitor 50 is fitted into the through hole 22 of the core substrate 21. Here, the core substrate 21 is set on a jig that includes a flat reference surface, and the chip capacitor 50 is forced against the reference surface when fitted into the through hole 22. This allows the chip capacitor 50 to be supported by the projections 23a to 24b in a level state. As a result, the chip capacitor 50 may be arranged so that main surfaces of the resin jacket 54 of the chip capacitor 50 (i.e., exposed lower surface of the chip capacitor 50 in the through hole 22 as viewed in the drawing) is parallel to (generally flush with) one main surface 21a (lower surface as viewed in the drawing) of the core substrate 21.

Figure 7:
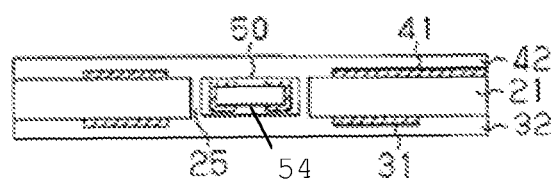
FIG. 7 is a cross-sectional view illustrating a manufacturing process of the wiring substrate.

Then, referring to FIG. 7, the insulation layers 32 and 42 are formed on the two opposite surfaces of the core substrate 21. For example, the core substrate 21 and the upper and lower surfaces of the chip capacitor 50 are each covered by a resin film. The resin film may be formed from a thermosetting resin. Further, the resin film may be in, for example, a semi-cured sate (B-stage state). The resin films are pressed against the core substrate 21 by a pressing machine or the like under a depressurized atmosphere to fill the space 26 (FIG. 1C) between the inner walls of the through hole 22 and the resin cover (e.g., resin jacket 54) of the chip capacitor 50 with resin. The projections 23a and 23b, formed on the shorter side inner walls of the tetragonal through hole 22 and the projections 24a and 24b, formed on the longer side inner walls of the tetragonal through hole 22, hold the chip capacitor 50 in the through hole 22. Thus, the chip capacitor 50 is not displaced even when pressure for charging resin into the through hole 22 is applied to the chip capacitor 50. This suppresses rotation and tilting or the like of the chip capacitor 50. The resin is then heated and hardened to form the insulator 25 and the insulation layers 32 and 42 illustrated in FIG. 1B.

Figure 8:
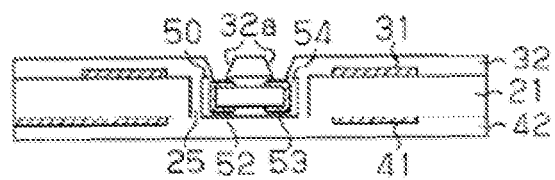
FIG. 8 is a cross-sectional view illustrating a manufacturing process of the wiring substrate.

Then, referring to FIG. 8, openings 32a are formed in the insulation layer 32 to expose portions of the connection terminals 52 and 53 of the chip capacitor 50. In FIG. 8, the structure obtained in FIG. 7 is reversed upside-down. A laser processing machine of the like is used to form the openings 32a. Here, the main surfaces of the resin jacket 54 of the chip capacitor 50 are generally flush with the main surface 21a of the core substrate 21. This reduces an insertion positional gap (differences) in the thickness of the insulation layer 32 covering the connection terminals 52 and 53 from the desired thickness (e.g., designed value). Thus, exposure of the main surfaces of the connection terminals 52 and 53 is ensured, and connection with the vias 34 (refer to FIG. 1A) that are formed next is ensured. The main surfaces of the resin jacket 54 of the chip capacitor 50 may be generally flush with the main surface of the wiring layer 31 formed on the core substrate 21. In this case, exposure of the main surfaces of the connection terminals 52 and 53 is ensured in the same manner.

Although not illustrated in the drawings, the vias 34 and the wiring layers 33 and 43 are formed through, for example, a semi-additive process or an additive process. In one example, the through hole 35 is formed by performing electroless copper plating or electrolytic copper plating on a through hole formed by a laser processing machine or a drilling machine. In one example, a photosensitive film is patterned into a film having a predetermined shape to form the resist films 37 and 44.

The operation of the wiring substrate 20 will now be described.

When manufacturing the wiring substrate 20, the projections 23a to 24b on the inner walls of the through hole 22 support the chip capacitor 50. Thus, there is no need for a tape that tentatively holds the chip capacitor 50 in the through hole 22. Accordingly, an adhesive agent of such a tape does not remain on the two opposite surfaces of the core substrate 21. Further, warping of the wiring substrate 20 or defoliation of the insulation layers 32 and 42 that would be caused by residual adhesive agent may be suppressed.

The projections 23a to 24b are formed on the inner walls facing the resin jacket 54 of the chip capacitor 50 in the through hole 22. Accordingly, the capacitor body 51 of the chip capacitor 50 does not come into engagement with the projections 23a to 24b. As a result, stress or the like is not applied when the capacitor body 51 is supported. This suppresses damages such as cracking of the capacitor body 51.

The distance between the tips of the opposite projections 23a and 23b and the distance between the tips of the opposite projections 24a and 24b are set to be shorter than the sizes of the corresponding portions of the chip capacitor 50. This allows the tips of the projections 23a to 24b to bite into the resin jacket 54 of the chip capacitor 50 and to form the straight engagement grooves 55a to 55d in the resin jacket 54. Engagement of the engagement grooves 55a to 55d with the projections 23a to 24b, which include tips extending continuously in the thickness-wise direction of the core substrate 21, suppresses rotation of the chip capacitor 50. By suppressing rotation of the chip capacitor 50 that would cause connection failures of the vias 34 corresponding to the connection terminals 52 and 53, connection failures of the vias 34 to the connection terminals 52 and 53 is reduced.

The projections 23a and 23b formed on the shorter side inner walls of the tetragonal through hole 22 may bit into the connection terminals 52 and 53 through the resin jacket 54 since dimension error in the connection terminals 52 and 53 is usually larger than that in the capacitor body 51. In this case, the engagement grooves 55a and 55b each continuously extend through the resin jacket 54 and the corresponding one of the connection terminals 52 and 53. The distance between the tips of the projections 23a and 23b is longer than the length of the capacitor body 51 and the distance between the tips of the projections 24a and 24b is longer than the width of the capacitor body 51. Therefore, the tips of the projections 23a to 24b do not reach the capacitor body 51. This reduces stress or the like to be applied to the capacitor body 51 when the capacitor body 51 is supported and suppresses damages such as cracking of the capacitor body 51.

The present embodiment has the advantages described below.

(1) The core substrate 21 includes the through hole 22 that receives the chip capacitor 50. The projections 23a to 24b formed on the inner walls of the through hole 22 support the chip capacitor 50. Accordingly, there is no need for tape to temporarily hold the chip capacitor 50 in the through hole 22. Thus, warping of the wiring substrate 20 or defoliation of the insulation layers 32 and 42 may be suppressed. This reduces defects in the wiring substrate 20.

(2) The projections 23a to 24b are formed in the through hole 22 on the inner walls facing the resin jacket 54 of the chip capacitor 50. This suppresses damage to the capacitor body 51 of the chip capacitor 50 and reduces defects in the wiring substrate 20.

It should be apparent to those skilled in the art that the present invention may be embodied in many other specific forms without departing from the spirit or scope of the invention. Particularly, it should be understood that the present invention may be embodied in the following forms.

Figure 9A:
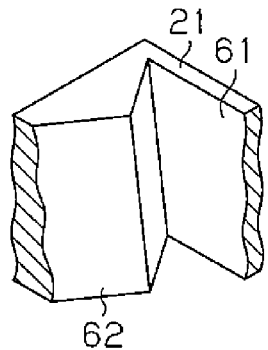
FIGS. 9A and 9B are perspective views illustrating projections that project into a through hole from a wall of the through hole in further modifications.
Figure 9B:
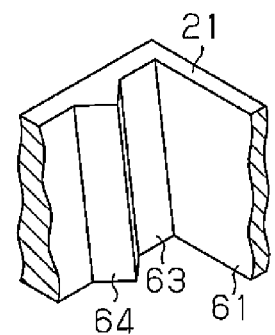

The shapes of the projections 23a to 24b may be changed. For example, as illustrated in FIG. 9A, a tapered through hole 61 may be formed. In this case, the distance between the tips of projections 62 formed on the inner walls of the through hole 61 may gradually shorten in a thickness-wise direction of the core substrate 21. This allows for the chip capacitor 50 to be easily fitted into the through hole 61. That is, the pressure applied to fit the chip capacitor 50 into the through hole 61 is decreased in comparison to when using a non-tapered through hole. This decreases the stress applied to the capacitor body 51 of the chip capacitor 50 and suppresses damage of the capacitor body 51. In this case, as illustrated in FIG. 9B, a wall 63 may include a portion forming a triangular projection 64 (triangular pillar).

Figure 10A:
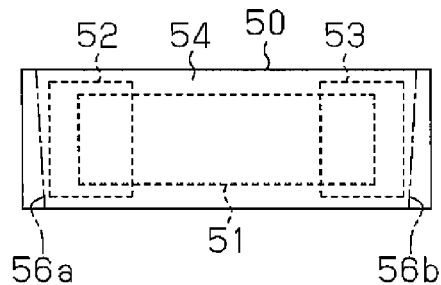
FIGS. 10A and 10B are side views illustrating chip capacitors in another modification.
Figure 10B:
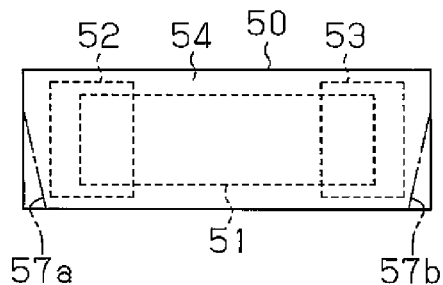

When the through hole 61 is tapered, as illustrated in FIG. 10A, the chip capacitor 50 may include engagement grooves 56a and 56b having depths that gradually vary in the thickness-wise direction of the core substrate 21. Further, the inclination of side surfaces of the grooves may be changed. For example, as illustrated in FIG. 10B, a though hole may be formed so that engagement grooves 57a and 57b are formed in portions of the resin jacket 54. Such engagement grooves 57a and 57b also function to hold the chip capacitor 50 in the same manner as in the above embodiment. Although not illustrated in FIGS. 10A and 10B, projections formed on the longer side inner walls of the through hole 22 may form in the resin jacket 54 engagement grooves having the same or similar shapes as the engagement grooves 56a, 56b, 57a and 57b formed by projections formed on the shorter side inner walls of the through hole 22 (for example, the projection 62 illustrated in FIG. 9A).

In the chip capacitor 50, each of the connection terminals 52 and 53 may be thinner at a peripheral portion than a central portion. In this regard, the connection terminals 52 and 53 are covered by the resin jacket 54 so that the projections do not abut against the capacitor body 51 of the chip capacitor 50 even when the through hole includes tapered walls. Therefore, damages such as cracking of the capacitor body 51 is suppressed. In addition, when forming a through hole including tapered walls with, for example, a pressing device, the open end of the through hole may be chamfered to avoid contact of the projections with the capacitor body 51 of the chip capacitor 50. The chamfering of the open end is performed at the same time as when the through hole 61 is formed with the pressing machine.

Although the projections 23a to 24b are formed to be triangular, as long as the chip capacitor 50 can be supported, the shapes of the projections may be changed. For example, arcuate or trapezoidal projections may be formed.

Figure 11A:
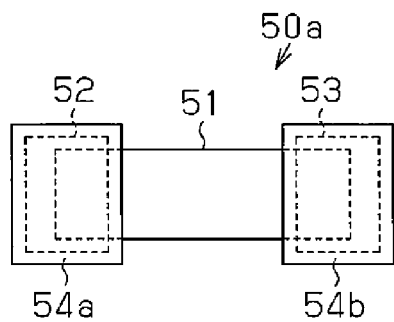
FIGS. 11A, 11B, 11C, 12A, 12B, 13A, 13B, 14A, 14B and 14C are schematic plan views and perspective views illustrating chip capacitors and projections in further modifications.
Figure 11B:
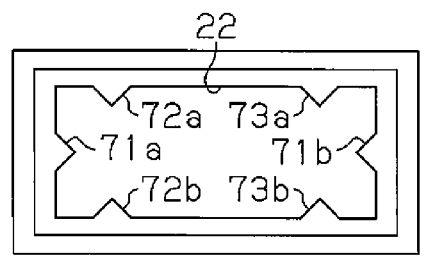
Figure 11C:
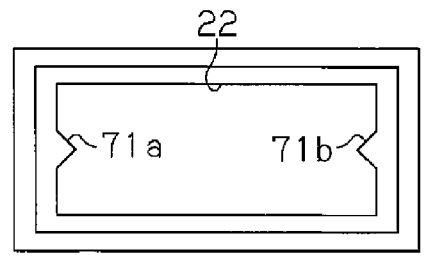

Positions of the projections may be determined in accordance with configuration of the resin jacket 54 of the chip capacitor 50. As an example of FIG. 11A, a chip capacitor 50a includes resin jackets 54a and 54b covering the connection terminals 52 and 53, respectively. Positions of the projections 71a, 71b, 72a, 72b, 73a, and 73b illustrated in FIG. 11B and positions of the projections 71a and 71b illustrated in FIG. 11C are determined in accordance with the configuration of the resin jackets 54a and 54b of the chip capacitor 50a of FIG. 11A. The projections 71a and 71b are formed on the shorter side inner walls of the through hole 22. The projections 72a and 72b, 73a, and 73b of FIG. 11B are formed on the longer side inner walls of the through hole 22. The projections 72a and 72b correspond to the resin jacket 54a. The projections 73a and 73b correspond to the resin jacket 54b. In the example of FIG. 11C, the longer side inner walls of the through hole 22 do not include projections, such as the projections 72a-73b of FIG. 11B.

Figure 12A:
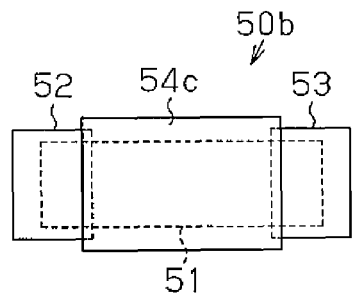
Figure 12B:
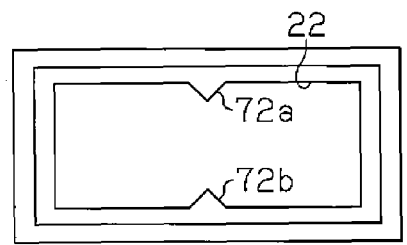

In an example of FIG. 12A, a chip capacitor 50b includes a resin jacket 54c covering the capacitor body 51. FIG. 12B illustrates projections 72a and 72b formed on the longer side inner walls of the through hole 22 to engage with the resin jacket 54c of the chip capacitor 50b.

Figure 13A:
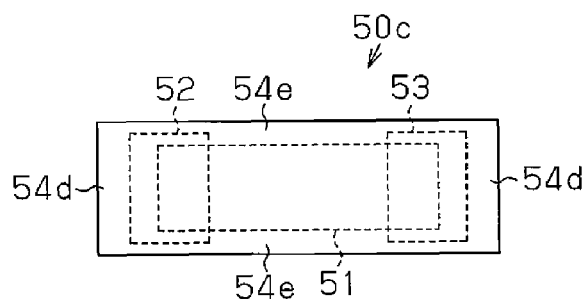
Figure 13B:
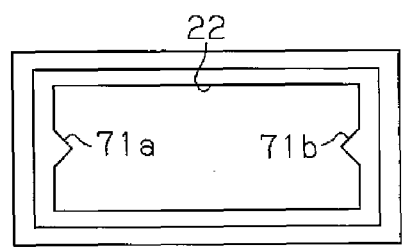

In an example of FIG. 13A, a chip capacitor 50c includes a resin jacket having different thicknesses. Opposite end portions 54d of the resin jacket have a thickness greater than that of an intermediate portion 54e. FIG. 13B illustrates projections 71a and 71b formed on the shorter side inner walls of the through hole 22 to engage with the end portions 54d of the resin jacket, respectively.

Figure 14A:
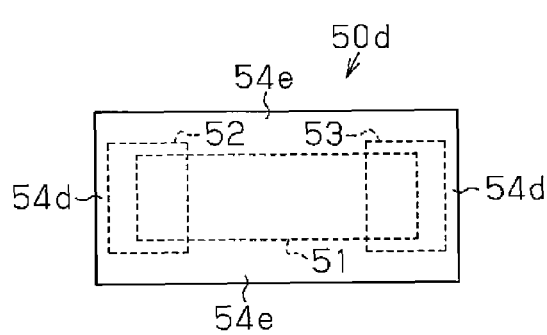
Figure 14B:
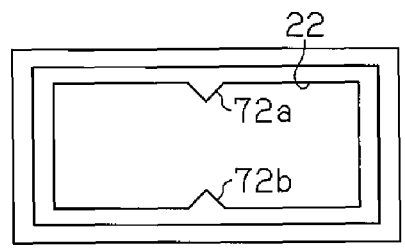
Figure 14C:
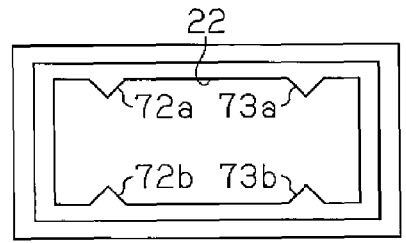

In an example of FIG. 14A, a chip capacitor 50d includes a resin jacket having different thicknesses. An intermediate portion 54e of the resin jacket has a thickness greater than those of opposite end portions 54d of the resin jacket. FIG. 14B illustrates projections 72a and 72b projecting from the longer side inner walls of the through hole 22 toward the capacitor body 51 of the chip capacitor 50d to engage with the intermediate portion 54e. FIG. 14C illustrates projections 72a, 72b, 73a and 73b projecting from the longer side inner walls of the through hole 22 toward the capacitor body 51 of the chip capacitor 50d to engage with the intermediate portion 54e. The shapes of the projections illustrated in FIGS. 11B, 11C, 12B, 13B, 14B and 14C may be changed.

The insulator 25 filled in the through hole 22 may be formed in a process that differs from the process in which the insulation layers 32 and 42 are formed.

Figure 15A:
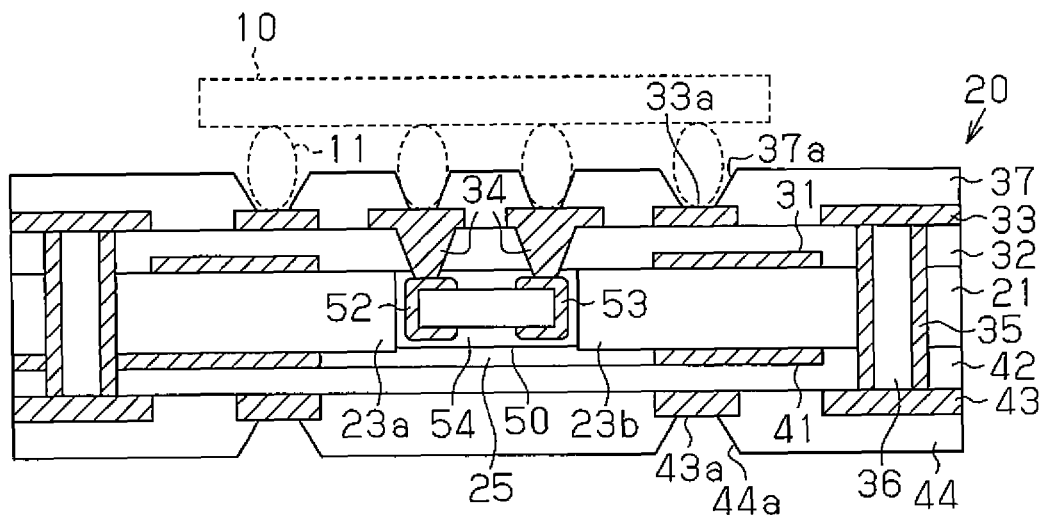
FIGS. 15A and 15B are cross-sectional views illustrating a wiring substrate in a further modification respectively taken at positions corresponding to FIGS. 1A and 1B.
Figure 15B:
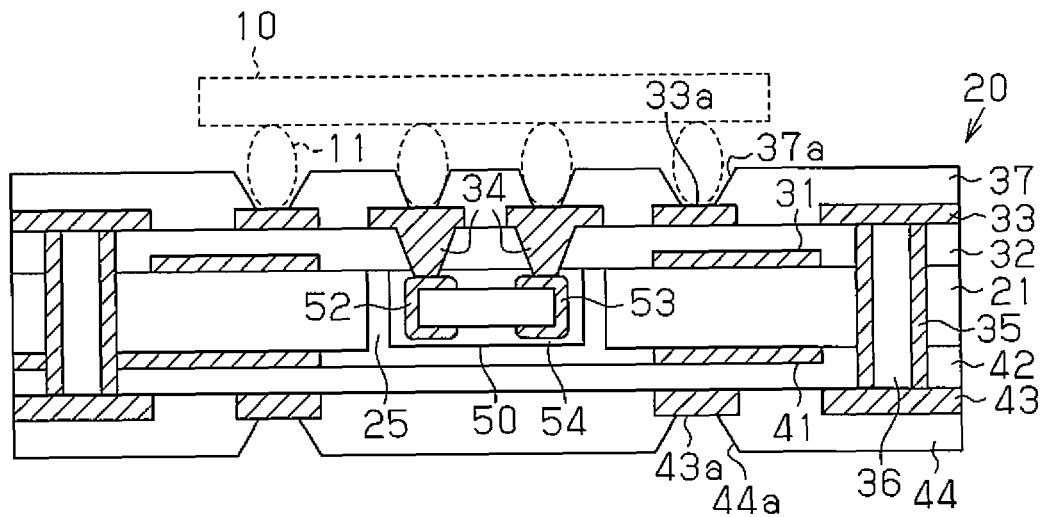

Referring to FIGS. 15A and 15B, the insulator 25 filling the through hole 22 and the insulation layers 32 and 42 may be formed from different resins.

The number of wiring layers and insulation layers may be changed.

Each through hole 35 illustrated in FIG. 1A is filled with the insulator 36. Instead, the through hole 35 may be filled with a conductor (e.g., copper) to form a filled via through hole.

The through hole 22 formed in the core substrate 21 of the wiring substrate 20 receives the chip capacitor 50. Instead, the through hole 22 may receive a different electronic component such as a chip resistor, an inductor, or a semiconductor device (LSI).

The through hole 22 receives the chip capacitor 50 that includes the two connection terminals 52 and 53. Instead, the through hole 22 may receive an electronic component such as a capacitor that includes three or more connection terminals.

The connection terminals of a chip capacitor may be formed on the long sides of the capacitor body 51 that is box-shaped.

The disclosure further encompasses various example(s) described below:

[Clause 1] A method for manufacturing the wiring substrate, the method comprising:

preparing a core substrate including a through hole and a peaked and elongated projection that projects into the through hole;

fitting an electronic component including a resin cover into the through hole from one surface of the core substrate with the peaked and elongated projection contacting the resin cover of the electronic component, wherein the fitting an electronic component includes biting into the resin cover with a tip of the peaked and elongated projection to form an elongated groove in the resin cover, the elongated groove extending in the fitting direction of the electronic component; and forming an insulation layer that fills the through hole and covers the electronic component.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A wiring substrate comprising:
    a core substrate including a first main surface, a second main surface, and a through hole;
    an electronic component including a resin cover and arranged in the through hole;
    a projection that projects from an inner wall of the through hole toward the resin cover of the electronic component so that the projection contacts a part of an outer surface of the resin cover while the remainder of the outer surface of the resin cover is spaced from contact with the inner wall of the through hole to form an empty space;
    an insulator that fills the empty space between the inner wall of the through hole and the electronic component;
    a first insulation layer that covers the electronic component and the first main surface of the core substrate;
    a second insulation layer that covers the electronic component and the second main surface of the core substrate; and
    an engagement groove that is formed in the resin cover of the electronic component and is engaged with the projection, extending along a direction in which the electronic component is fitted into the through hole.

2. The wiring substrate according to claim 1, wherein
    the projection is one of a plurality of projections including a pair of projections respectively formed on two opposing walls of the through hole, and
    a distance between tips of the pair of projections formed on the two opposing walls of the through hole is set to be smaller than the dimension of a corresponding portion of the resin cover of the electronic component.

3. The wiring substrate according to claim 1, wherein the resin cover and the insulator are formed from the same thermosetting resin.

4. The wiring substrate according to claim 1, wherein the projection extends continuously from the first main surface to the second main surface on the core substrate.

5. The wiring substrate according to claim 1, wherein
    the projection includes a tip, and
    the tip is inclined so that a distance from the resin cover of the electronic component gradually changes from the first main surface toward the second main surface of the core substrate.

6. The wiring substrate according to claim 1, wherein the core substrate includes a reinforcement material.

7. The wiring substrate according to claim 1, wherein
    the insulator, the first insulation layer, and the second insulation layer are formed from the same thermosetting resin; and
    the insulator is filled between the electronic component and the inner wall of the through hole when heating and pressurizing the first insulation layer and the second insulation layer.

8. The wiring substrate according to claim 1, wherein
    the resin cover includes a relatively thicker portion and a relatively thinner portion, and
    the engagement groove is formed in the relatively thicker portion of the resin cover.

9. The wiring substrate according to claim 1, wherein
    the electronic component includes a connection terminal covered by the resin cover,
    the engagement groove continuously extends through the resin cover and the connection terminal.

10. A wiring substrate comprising:
    a core substrate including a through hole and a peaked and elongated projection projecting into the through hole;
    an electronic component fitted into the through hole from one surface of the core substrate, wherein the electronic component includes a resin cover, a part of an outer surface of the resin cover being engaged with the peaked and elongated projection, and the remainder of the outer surface of the resin cover is spaced from contact with an inner wall of the through hole to form an empty space; and
    an insulation layer that fills the empty space in the through hole and covers the electronic component,
    wherein the peaked and elongated projection includes a tip that bites into the resin cover to form an elongated groove that is in close conformance to the tip of the peaked and elongated projection.

11. The wiring substrate according to claim 10, wherein
    the core substrate includes a plurality of peaked and elongated projections engaged with multiple portions of the resin cover, and
    two of the plurality of peaked and elongated projections face each other to sandwich the electronic component.

12. The wiring substrate according to claim 10, wherein
    the electronic component includes an electronic component body and connection terminals arranged at opposite ends of the electronic component body,
    the resin cover includes a first portion covering the electronic component body and second portions covering the connection terminals, and
    the core substrate includes
        a first plurality of peaked and elongated projections each engaged with the first portion of the resin cover, and
        a second plurality of peaked and elongated projections engaged with the second portions of the resin cover, respectively.

13. The wiring substrate according to claim 12, wherein
    the through hole includes an oblong opening on a surface of the core substrate,
    the second plurality of peaked and elongated projections project along a longitudinal axis of the oblong opening of the through hole, and
    the first plurality of peaked and elongated projections project in a direction orthogonal to the longitudinal axis of the oblong opening of the through hole.

* * * * *